May 8, 1962 K. H. KNICKMEYER 3,033,454
COUNTER
Filed Oct. 30, 1958 3 Sheets-Sheet 1

INVENTOR
KENTON H. KNICKMEYER
BY Donald F Voss
ATTORNEY

May 8, 1962 K. H. KNICKMEYER 3,033,454

COUNTER

Filed Oct. 30, 1958 3 Sheets-Sheet 2

May 8, 1962 K. H. KNICKMEYER 3,033,454

COUNTER

Filed Oct. 30, 1958 3 Sheets-Sheet 3

United States Patent Office 3,033,454

Patented May 8, 1962

3,033,454

COUNTER

Kenton H. Knickmeyer, Endicott, N.Y., assignor to International Business Machines Corporation, New York, N.Y., a corporation of New York

Filed Oct. 30, 1958, Ser. No. 770,652

7 Claims. (Cl. 235—155)

This invention relates to counters and, more particularly, to electromechanical counters.

The counter in this invention is comprised of apparatus which will provide a relatively high power output indicative of a number of events or impulses applied thereto and expressed in the form of a decimal number or value. The counter has a plurality of identical stages, the number of stages may be varied to provide the desired capacity for the counter, which are operable in a binary manner and associated with conditioning elements connected in a predetermined manner to effect discrete decimal outputs.

The first stage of the counter is under control of means for designating the counting period. The successive stages are selectively conditioned or primed for operation by means operably associated with the preceding stage or stages. The means for priming the succeeding stages in a selected manner are also utilized for code conversion to convert from binary to decimal notation.

In this manner, a relatively inexpensive counter having a high power output signal indicative of a decimal value is provided.

It is a principal object of this invention to provide an improved counter which utilizes, for code conversion, the same elements used for priming the stages of the counter during the operation thereof.

Another object of this invention is to provide an improved counter which has an output suitable for operating magnet coils and other like devices.

Still another object of this invention is to provide an improved counter which has a minimum number of components.

An additional object of this invention is to provide an improved counter which has minimum power supply requirements.

A further object of this invention is to provide an electromechanical counter which is capable of suitably operating at a relatively high repetition rate.

Still a further object of this invention is to provide an electromechanical counter which is capable of asynchronous operation.

Another object of this invention is to provide an electromechanical counter which may be reset instantaneously.

An additional object of this invention is to provide an electromechanical counter which has discrete decimal outputs.

A further additional object of this invention is to provide an electromechanical counter which is relatively inexpensive.

Other objects of the invention will be pointed out in the following description and claims and illustrated in the accompanying drawings, which disclose, by way of examples, the principle of the invention and the best mode, which has been contemplated, of applying that principle.

In the drawings:

FIG. 1 is a diagrammatic illustration of the counter embodying the principles of the invention;

FIGS. 2*a* and 2*b*, with FIG. 2*b* disposed to the right of FIG. 2*a*, taken together are a schematic representation of the counter circuitry and means for generating the impulses to be applied thereto;

GENERAL

Figure 1:
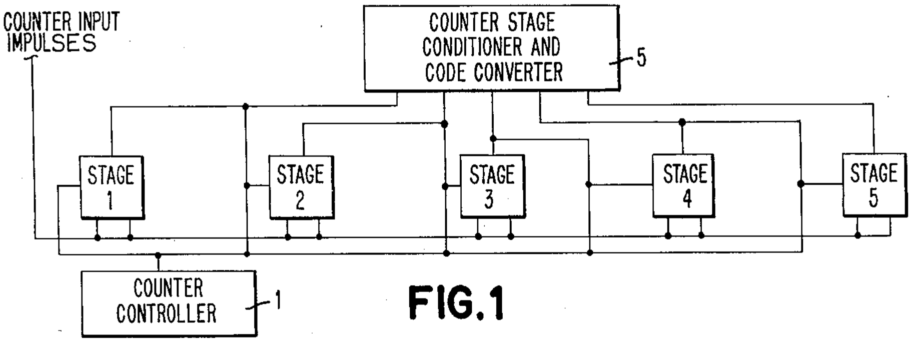

The counter in this invention is shown diagrammatically in FIG. 1 as comprised of apparatus which will provide a relatively high power output indicative of a number of events or impulses applied thereto and expressed in the form of a decimal number or value. The counter has a plurality of identical stages, the number of stages may be varied to provide the desired capacity for the counter, which are operable in a binary manner and associated with conditioning elements connected in a predetermined manner to effect discrete decimal outputs.

In this example, the counter is comprised of five stages, 1–5, inclusive, and the first stage of the counter is under control of means for designating the counting period or a counter controller 1 which also provides for reset of the counter. The successive stages, or stages 2–5, inclusive, are selectively conditioned or primed for operation by means operably associated with the preceding stage or stages. The means for priming the succeeding stages in a selected manner are also utilized for code conversion to convert from binary to decimal notation and is represented in FIG. 1 as a counter stage conditioner and code converter 5.

In this manner, a relatively inexpensive counter having a high power output signal indicative of a decimal value is provided.

*Detailed Description*

Figure 2A:
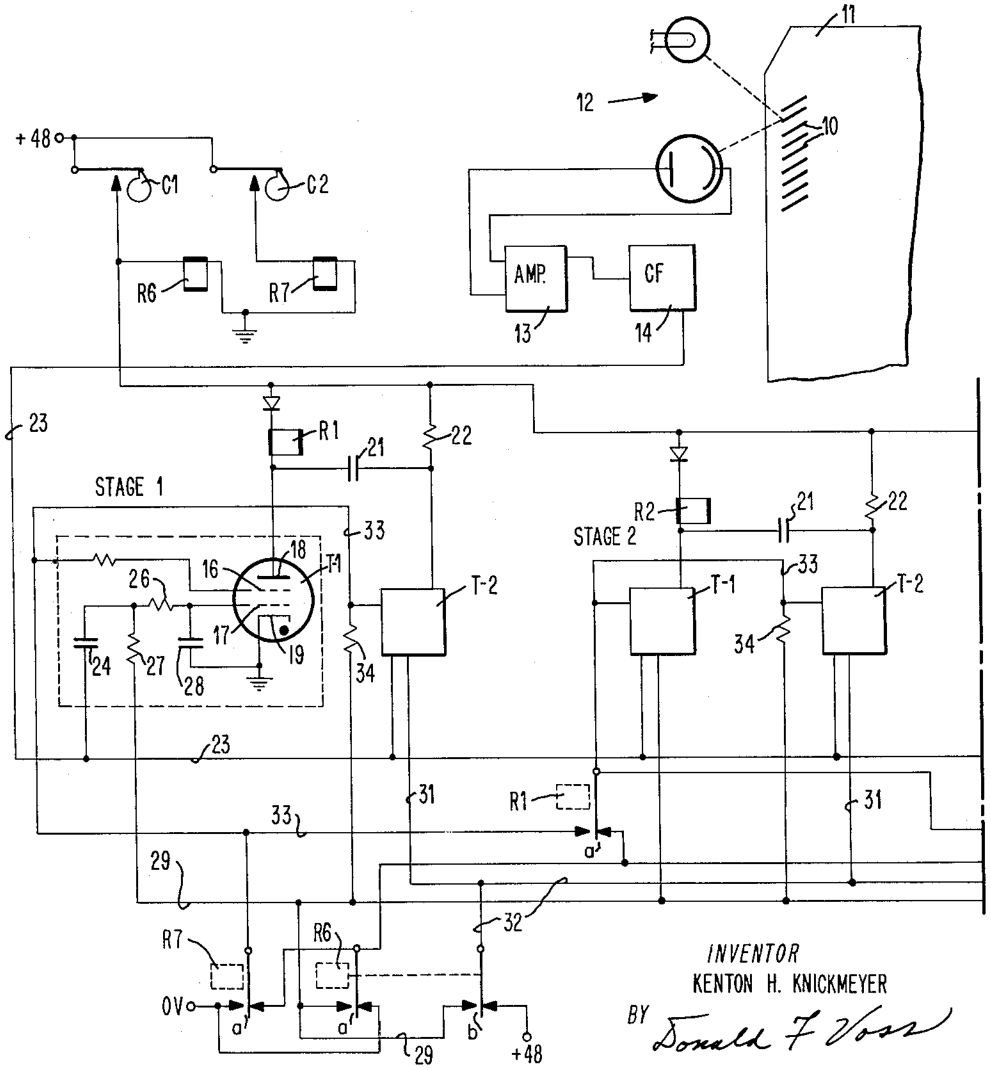

The counter embodying this invention may be utilized, as shown in FIG. 2*a*, for counting identifying marks 10 on a record card 11 for controlling operation of accounting machines and other like devices.

The identifying marks 10 on the record card 11 may be scanned by a photoelectric scanner 12 to generate impulses as relative motion takes place between the card and photoelectric scanner 12. The impulses so generated are usually given power through an amplifier 13 and shaped by a cathode follower 14 before being applied to the counter.

Figure 2B:
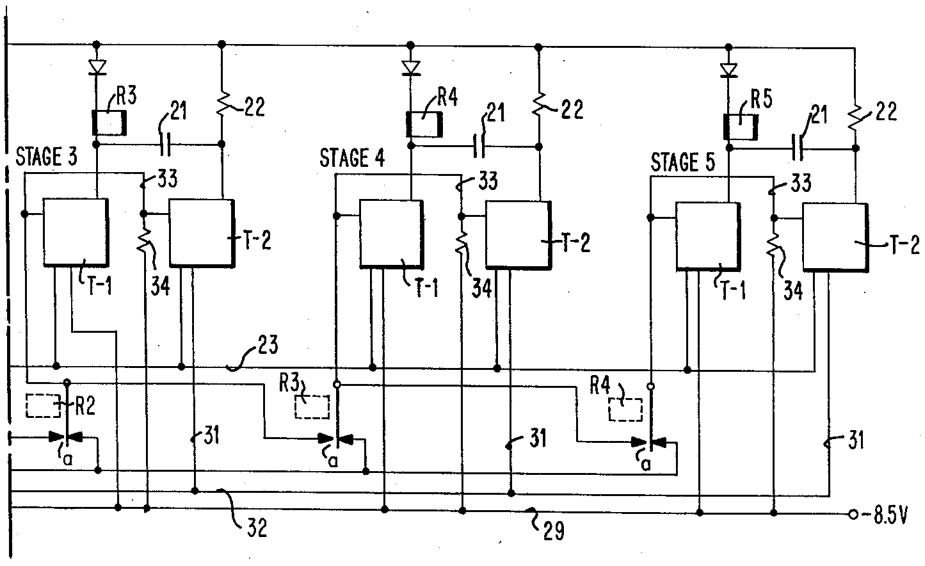

The counter in this example consists of five stages, 1–5, inclusive, FIGS. 2*a* and 2*b*, where each stage is composed of a pair of thyratrons T–1 and T–2 or other electronic devices which have a high power output and require conditioning or priming before being rendered operable upon receiving an impulse.

The thyratrons T–1 and T–2 of each stage are of the conventional type; each having a shield grid 16, a control grid 17, a plate 18 and a cathode 19. Since all the thyratrons are identical, the elements of the thyratrons and the shield and control grid circuitry are shown for thyratron T–1 of the stage one only, as enclosed by the dashed lines. The thyratrons T–1 or T–2 will ignite or fire upon applying a positive-going signal to the control grids 17 when the shield grids 16 have been properly biased or conditioned. Once the thyratrons T–1 or T–2 fire, their control grids 17 lose control thereover; however, they may then be extinguished by lowering their plate potential or by raising their cathode potential. The thyratrons T–1 and T–2 are capable of conducting large amounts of current and are, therefore, quite suitable for controlling operation of relays and magnet coils, as will be described later.

The thyratrons T–1 and T–2 of each stage are coupled together for bistable or binary operation. The plates 18 of the thyratrons T–1 are capacitively coupled by means of capacitors 21 to the plates 18 of the thyratrons T–2.

In this manner, as it will be described in detail hereinafter, when thyratron T–1 of any stage is fired or rendered conductive, the associated thyratron T–2 is extinguished or rendered nonconductive.

The thyratrons T–1 of each stage have relays R1, R2, R3, R4 and R5, respectively, electrically connected in their plate circuits. The purpose of the relays R1, R2, R3, R4 and R5 is twofold. Each relay R1–R5, inclusive, when energized, selectively biases the shield grids 16 of thyratrons T–1 and T–2 of succeeding stages in a predetermined manner whereby the counter will operate in a binary fashion even though the impulse repetition rate is asynchronous. Each relay R1–R5, inclusive, is also effective to convert the binary notation of the value in the counter to discrete decimal outputs.

The thyratrons T–2 each have a resistor 22 in their plate circuit. The cathodes 19 of all the thyratrons T–1 and T–2 are connected to 0 volts.

Each impulse generated by the photoelectric scanner 12 is simultaneously applied to the control grid 17 of each of the thyratrons T–1 and T–2 through a common connection 23. The control grid circuit for each thyratron T–1 and T–2 also includes a capacitor 24 and resistors 26 and 27. The capacitor 24 is connected between the juncture of resistors 26 and 27 and the common connection 23. Also, a capacitor 28 is connected between the control grid 17 and cathode 19. The resistors 26 and 27 are connected in series between the control grid 17 and a common bus conductor 29 biased at a potential of −8.5 volts. The control grids 17 of the thyratrons T–2 are connected by conductors 31 to a common connection 32 which may be selectively connected to a potential of +48 volts or −8.5 volts by means of a relay R6 through relay contacts R6*b*. The common connection 32 is placed at +48 volts when it is desired to reset the counter and, otherwise, it is normally at −8.5 volts during operation of the counter.

The shield grids 16 of thyratrons T–1 and T–2 of each stage are commonly connected by the connections 33. Further, the shield grids for thyratrons T–2 are connected through resistors 34 to the common connection 29 which is at −8.5 volts. Hence, in order for thyratrons T–1 or T–2 to fire upon an impulse being applied to their control grids 17, their shield grids 16 must be conditioned or primed by being biased at 0 volts through the common shield grid connection 33.

Figure 4:
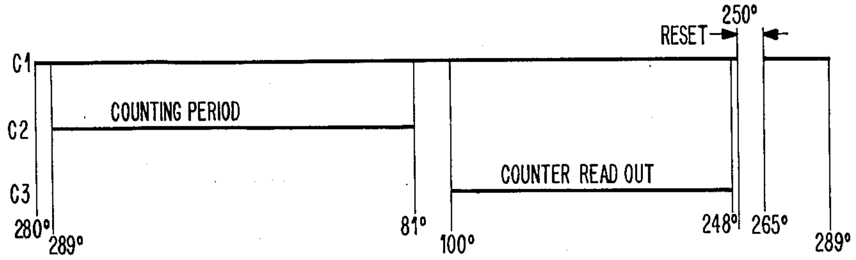
FIG. 4 is a diagram showing the make and break periods of the circuit breakers.

The shield grids for thyratrons T–1 and T–2 of stage one of the counter are biased at 0 volts, after reset of the counter, through the closed normally open contact R7*a* of a relay R7 for designating the counting period. There are two relays for controlling the counting period. One relay R7 is for designating the counting period and the other relay R6 effects reset of the counter. The relay R7 having normally open and closed contact points R7*a* is utilized for designating the counting period and, when energized, it transfers its points to apply a 0 volt bias to the shield grids 16 of thyratrons T–1 and T–2 of stage one and to permit the shield grids 16 of the thyratrons T–1 and T–2 of the subsequent stages also to become biased at 0 volts. The relay R7 is energized under control of a cam-operated contact C2 which makes at 289 degrees and breaks at 81 degrees, as shown in FIGS. 2*a* and 4. Of course, the relay R7 for designating the counting period can be energized as desired to suit any particular requirements for the counting period.

Reset of the counter, in this example, takes place when both relays R6 and R7 are de-energized. When the counter is reset, the thyratrons T–2 of each stage are conducting and the thyratrons T–1 are extinguished. The relay R6 is energized under control of a cam-operated contact C1 which makes at 265 degrees and breaks at 250 degrees, as seen in FIGS. 2*a* and 4. With the relays R6 and R7 de-energized, from 250 degrees to 265 degrees, the shield grids 16 of the thyratrons T–1 and T–2 for all the stages of the counter are at 0 volts bias; hence, any positive-going signal applied to the control grids 17 of the thyratrons T–1 and T–2 will cause the nonconducting thyratron of each stage to fire and, consequently, the already conducting thyratrons will extinguish. When relay R6 is de-energized, the normally closed contact R6*b* will permit a signal of +48 volts to be applied to the control grids of thyratrons T–2 of each stage of the counter and thereby render them conductive if not already conducting. With the thyratrons T–2 conducting, the thyratrons T–1 will be cut off as their plate potential is lowered by the negative-going capacitive coupled impulses coming from the plates of thyratrons T–2. In this manner, the counter is reset when all thyratrons T–2 are conducting; however, there are other ways in which this counter could be reset.

After the counter is reset, the common control grid connection 32 is transferred from +48 volts to −8.5 volts through the transferred or closed normally open relay contact R6*b* as the relay R6 is energized. Further, with R6 energized, the normally open contact R6*a* is closed and the control grids 17 for all the thyratrons T–1 and T–2 of each stage of the counter are biased to −8.5 volts.

The shield grids of thyratrons T–1 and T–2 of stage two, after reset of the counter, are normally biased to −8.5 volts through the normally closed contact R1*a* of relay R1 electrically connected in the plate circuit of thyratron T–1 of stage one and through the transferred contact R6*a* of the relay R6. However, with thyratron T–1 of stage one fired after the first impulse is applied to the counter, relay R1 is operated and the normally open contact R1*a*, which is connected to 0 volts through the transferred or closed normally open relay contact 7*a*, is connected to the shield grid of thyratrons T–1 and T–2 of stage two to bias the same to 0 volts. Although thyratron T–1 of stage one is fired, relay R1 does not become energized in sufficient time to permit the first impulse to fire thyratron T–1 of the second stage. Hence, with relay R7 operated, the thyratron T–1 of stage two cannot be fired or turned "on" unless thyratron T–1 of stage one has been fired to operate the relay R1. Of course, once thyratron T–1 of stage two is fired, thyratron T–1 of stage one may be turned off, and is actually turned off, without affecting the operation of the fired thyratron T–1 of stage two. While the thyratron T–1 of stage one becomes extinguished by the second impulse applied to the counter, the relay R1 does not de-energize immediately or remains energized for a sufficient period of time to permit the second impulse to fire thyratron T–1 of stage two. However, as thyratron T–1 of stage two fires, the relay R2 is not energized fast enough to permit the second impulse to fire thyratron T–1 of stage three.

The shield grids of thyratrons T–1 and T–2 of stage three are normally connected to −8.5 volts through the normally closed relay contact R2*a* and the closed normally open relay contact 6*a* which closed when relay R6 had been operated. The shield grids of thyratrons T–1 and T–2 of stage three may be biased to 0 volts upon relay R2 being operated provided relay R1 is also operated. When relay R2 is operated, the normally open relay contact R2*a* is connected to the shield grids of thyratrons T–1 and T–2 of stage three. The normally open relay contact R2*a* is connected in series with the relay contacts R1*a* of the relay R1, the normally open relay contacts R1*a* being connected to 0 volts through the transferred normally open relay contact R7*a* of relay R7 and the normally closed relay contact R1*a* being connected to −8.5 volts through the transferred normally open relay contact 6*a*. Hence, it is seen that thyratron T–1 of stage three cannot be fired unless the thyratrons T–1 of stages one and two have been fired to operate relays R1 and R2, respectively. It may be noted that, once thyratron T–1 of stage three is fired, the thyratrons T–1 of stages one and two may be turned off without affecting the conduction of the thyratron T–1 of stage three.

The shield grids for the thyratrons T–1 and T–2 of stage four are normally biased at −8.5 volts through the normally closed contact R3*a* of the relay R3 and the transferred normally open contact R6*a* of the relay R6 which has been previously operated and remains operated during the entire counting period, as selected. When relay R3 is operated, the shield grids of the thyratrons T–1 and T–2 of stage four will be biased to 0 volts provided both relays R1 and R2 are also operated. Hence, a positive-going signal applied to the control grids 17 of thyratrons T–1 and T–2 of stage four would cause the nonconducting thyratron of stage four to go into conduction and the conducting thyratron to extinguish. If either relay R1 or relay R2 is not operated, even though relay R3 is operated, the shield grids of thyratrons T–1 and T–2 of stage four will not be primed so as to render either thyratron T–1 or T–2 of that stage capable of being fired upon an impulse being applied to their respective control grids 17.

The shield grids for the thyratrons T–1 and T–2 of stage five are normally biased at −8.5 volts through the normally closed contact R4*a* of the relay R4 in the plate circuit of thyratron T–1 of stage four and through the transferred normally open contact R6*a* of relay R6. When relay R4 is energized, and provided relays R1, R2 and R3 are energized, 0 volts will be applied through the transferred normally open contact R7*c* of relay R7 for designating the counting period to the shield grids of thyratrons T–1 and T–2 of stage five. With the shield grids of thyratrons T–1 and T–2 of stage five at 0 volt bias, a positive-going signal applied to the control grids 17 thereof will cause the nonconducting thyratron of the pair to become conductive and thereby extinguish the already conducting thyratron. The thyratron T–1 of stage five also has a relay R5 in its plate circuit. Since stage five is the last stage of the counter, the relay R5 is not utilized to condition any other stages of the counter; but it is utilized for code conversion, as will be described shortly.

With a 5-stage counter embodying the present invention, it is possible to provide discrete decimal outputs of 0–31, inclusive; however, in this example, only decimal outputs of 0–25, inclusive, are effected, as shown in FIG. 2. The relay R1 in the plate circuit of thyratron T–1 of stage one has normally open and closed contacts R1*b* in addition to the normally open and closed contacts R1*a*. The normally closed contact R1*b* of relay R1 is connected to the transfer contact R2*c* associated with normally open and closed contacts R2*c* of the relay R2, while the normally open contact R1*b* of the relay R1 is connected to the transfer contact R2*b* associated with normally open and closed contacts R2*b*, also of the relay R2, which is connected in the plate circuit of thyratron T–1 of stage two.

The normally closed contact R2*c* of the relay R2 is connected to the transfer contact R3*e* associated with normally open and closed contacts R3*e* of the relay R3. The normally open contact R2*c* of the relay R2 is connected to the transfer contact R3*d* associated with normally open and closed contacts R3*d* of the relay R3. Similarly, the normally open and closed contacts R2*b* of the relay R2 are connected to the transfer contacts R3*b* and R3*c* associated with the normally open and closed contacts R3*b* and R3*c*, respectively.

The normally open and closed contacts R3*b*, R3*c*, R3*d* and R3*e* of the relay R3 are connected to the transfer contacts R4*b*, R4*c*, R4*d*, R4*e*, R4*f*, R4*g*, R4*h* and R4*i* associated with the normally open and closed contacts R4*b*, R4*c*, R4*d*, R4*e*, R4*f*, R4*g*, R4*h* and R4*i* of the relay R4, respectively, which are, in turn, connected to transfer contacts R5*b*, R5*c*, R5*d*, R5*e*, R5*f*, R5*g*, R5*h*, R5*i*, R5*j*, R5*k*, R5*l*, R5*m*, R5*n*, R5*o*, R5*p* and R5*q* of the relay R5 and associated with normally open and closed contacts R5*b*, R5*c*, R5*d*, R5*e*, R5*f*, R5*g*, R5*h*, R5*i*, R5*j*, R5*k*, R5*l*, R5*m*, R5*n*, R5*o*, R5*p* and R5*q*.

By examining FIGS. 3 and 5, it will be seen that, when the relays R1, R2, R3, R4 and R5 are operated as indicated in the following table, the decimal outputs 0–25 will be effected:

RELAYS

| Decimal Outputs | R1 | R2 | R3 | R4 | R5 |
|---|---|---|---|---|---|
| 0 | — | — | — | — | — |
| 1 | X | — | — | — | — |
| 2 | — | X | — | — | — |
| 3 | X | X | — | — | — |
| 4 | — | — | X | — | — |
| 5 | X | — | X | — | — |
| 6 | — | X | X | — | — |
| 7 | X | X | X | — | — |
| 8 | — | — | — | X | — |
| 9 | X | — | — | X | — |
| 10 | — | X | — | X | — |
| 11 | X | X | — | X | — |
| 12 | — | — | X | X | — |
| 13 | X | — | X | X | — |
| 14 | — | X | X | X | — |
| 15 | X | X | X | X | — |
| 16 | — | — | — | — | X |
| 17 | X | — | — | — | X |
| 18 | — | X | — | — | X |
| 19 | X | X | — | — | X |
| 20 | — | — | X | — | X |
| 21 | X | — | X | — | X |
| 22 | — | X | X | — | X |
| 23 | X | X | X | — | X |
| 24 | — | — | — | X | X |
| 25 | X | — | — | X | X |

Relay Operated X.
Relay Unoperated —.

In some instances, it may be undesirable to have a continuous or progressive decimal output. Perhaps it may be required that there be only one decimal output from the counter during any one counting period. For example, if four impulses are applied to the counter, it may be undesirable to have an output from the counter for impulses 1, 2 and 3. The value representing the total number of impulses applied to the counter may be the only decimal value of interest. In order to permit the counter to have a decimal output representing the total number of impulses applied to the counter during any one counting period, the counter is effectively scanned after the counting period has taken place. This is achieved by means of a cam-operated contact C3, FIG. 3, which makes at 100 degrees and breaks at 248 degrees, as seen in FIG. 4. The contact C3, FIG. 2, is connected between +48 volt supply and the transfer contact R1*b* of relay R1.

Hence, unless he contact C3 is established or made to connect the +48 volt supply to the transfer contact R1*b* of the relay R1, there will be no output from the counter. Since the contact C3 makes at 100 degrees and breaks at 248 degrees, FIG. 4, there will be an output from the counter only after the counting period has been completed and, of course, before reset of the counter has taken place.

*Counter Operation*

In the example for illustrating the present invention, the operation of the counter may be described by beginning with the reset step which occurs when the relays R6 and R7 are both de-energized. The relays R6 and R7 are both de-energized when disconnected from the +48 volt supply by the contacts C1 and C2 during the period from 250 degrees to 265 degrees. With the relays R6 and R7 de-energized, the shield grids of the thyratrons T–1 and T–2 for all stages of the counter are connected to 0 volts through the normally closed contacts R6*a* and R7*a*. Further, under these conditions, the control grids 17 of the thyratrons T–2 for all stages of the counter are connected to +48 volts through the normally closed contact R6*b*. When the control grids 17 of the thyratrons T–2 are connected to +48 volts and their shield grids 16 having been conditioned by 0 volt bias applied thereto, the same will fire. As the thyratrons T–2 of each stage fire, there is a potential drop in their plate circuits which is applied to the plates 18 of the thyratrons T–1 through the capacitors 21 to cut off those thyratrons T–1, if any, that are conducting. All of the stages of the counter are now reset and, in this condition, the thyratrons T–2 of each stage are fired.

The counting period, FIG. 4, does not begin until both relays R6 and R7 are energized. The contacts C1, FIGS. 2a and 4, make at 265 degrees to connect the relay R6 to +48 volt supply and thereby energize the same. With the relay R6 energized, the normally open contact R6*b* is closed to apply −8.5 volts bias to the control grids 17 of the thyratrons T–2 for all stages of the counter. However, once the thyratrons T–2 are fired, their control grids 17 do not have any further control and, therefore, when the voltage applied to the control grids 17 of the thyratrons T–2 is changed from +48 volts to −8.5 volts, there is no effect on the thyratrons T–2. Also, as relay R6 is energized, the normally open contact R6*a* is closed to connect the shield grids of the thyratrons T–1 and T–2 for all stages of the counter to the conductor 29 which is at −8.5 volts. Under the conditions just mentioned, any impulses applied to the control grids 17 of the thyratrons T–1 would not cause them to conduct since the associated shield grids 16 are held at −8.5 volts.

Accordingly, the counting period does not begin until the relay R7 is energized by means of the contact C2 which is operated at 289 degrees to connect the relay R7 to the +48 volt supply and thereby cause the same to become energized. With the relay R7 energized, the normally open contact R7*a* is closed. When the normally open contact R7*a* is closed, 0 volts bias is applied to the shield grids of the thyratrons T–1 and T–2 of stage one only; the shield grids of the thyratrons T–1 and T–2 of all other stages of the counter are at −8.5 volts. While the shield grids of the thyratrons T–1 and T–2 for the other stages of the counter are, at the present, at −8.5 volts, they each may be selectively biased to 0 volts as the relays R1, R2, R3, R4 and R5 in the plate circuits of the thyratrons T–1 of the preceding stages are selectively operated.

Thus, the counting period begins at 289 degrees, as seen in FIG. 4, or at the time the relay R7 is energized; the relay R6 already had been energized at 265 degrees. With the thyratrons T–2 for all stages conducting, the counter having been reset, and with the shield grids of thyratrons T–1 and T–2 of stage one biased at 0 volts, an impulse generated as the first identifying mark on the record card scanned by the photoelectric scanner 12 is simultaneously applied to the control grids of the thyratrons T–1 and T–2 of all stages. Since the shield grids of the thyratrons T–1 and T–2 of stage one are the only shield grids biased at 0 volts, the impulse applied to the control grids of thyratrons T–1 and T–2 of all stages of the counter will cause only the thyratron T–1 of stage one to fire; thyratron T–2 of stage one already had been conducting. Hence, although the shield grid 16 of thyratron T–2 of stage one is properly conditioned, the impulse applied to its control grid 17 has no effect.

As the thyratron T–1 of the first stage fires, two actions take place. The relay R1 in the plate circuit of thyratron T–1 of stage one is energized. Also, there is a voltage drop in the plate circuit of thyratron T–1 which is capacitively coupled to the plate of thyratron T–2 of stage one to cause same to extinguish. With relay R1 energized, the normally open contact R1*a* is closed to apply 0 volts to the shield grids of thyratrons T–1 and T–2 of stage two. Although the thyratron T–1 of stage two is conditioned for firing as the relay R1 is energized, the first impulse to the counter will not cause thyratron T–1 of stage two to fire since its duration is much less than the time involved to energize the relay R1 to close the normally open contact R1*a*. Further, with relay R1 energized, the normally open contact R1*b*, FIG. 3, is closed; and, if no further impulses were applied to the counter during the counting period, 289 degrees to 81 degrees, then there would be a discrete decimal output of 1 read out of the counter during the counter read out period which is from 100 degrees to 248 degrees, FIG. 4. The circuit for the discrete decimal output of 1 is traceable in FIG. 3 from the +48 volt supply through the closed normally open contact R1*b* and the normally closed contacts R2*b*, R3*c*, R4*e* and R5*i*, respectively, to the output hub H1.

The counter would be reset in the manner indicated above during the counter reset period from 250 degrees to 265 degrees and the counting period would again start at 289 degrees, as described above, and the first subsequent impulse to the counter would fire the thyratron T–1 and thereby cause thyratron T–2 of stage two, respectively, to extinguish. As thyratron T–1 of stage one fires, the relay R1 is energized and the shield grids of thyratrons T–1 and T–2 of stage two are conditioned by being biased at 0 volts. Assume now, with the thyratrons of stage one, T–1 conducting and T–2 extinguished, respectively, and with relay R1 energized, that a second impulse is applied to the control grids of thyratrons T–1 and T–2 of all stages of the counter. Under these conditions, thyratron T–2 of stage one would ignite and thyratron T–1 extinguish. As thyratron T–1 extinguishes, the relay R1 becomes de-energized and the normally open contacts R1*a* and R1*b*, which had been closed, are opened. However, before the relay R1 becomes de-energized, the second impulse applied to the counter causes thyratron T–1 of stage two to fire and thyratron T–2 thereof to extinguish. As thyratron T–1 of stage two fires, the relay R2 in its plate circuit is energized and thereby closes the normally open contacts R2*a*, R2*b* and R2*c*. Once thyratron T–1 of stage two fires, the fact that thyratron T–1 of the first stage is extinguished and relay R1 had become de-energized has no effect on thyratron T–1 of the second stage. Further, although upon application of the second impulse the thyratron T–1 of stage two is fired and thereby energizes relay R2, the thyratron T–1 of stage three is not fired by the second impulse because the second impulse disappears before the relay R2 is energized.

Also, if no further impulse were applied to the counter during the remaining counting period, the decimal output 2 is available at the output hub H2 at counter read out time, 100 degrees to 248 degrees. The decimal output 2 at output hub H2, FIG. 3, is traceable from the +48 volt supply through the normally closed contact R1*b*, the closed normally open contact R2*c*, and the normally closed contacts R3*d*, R4*g* and R5*m*, respectively, to the output hub H2.

However, if there were a third impulse applied to the counter during the counting period, the thyratrons T–1 and T–2 of stage one would fire and extinguish, respectively. The thyratrons T–1 and T–2 of stage two would remain in the same state or be unaffected by the third impulse since their shield grids have not been conditioned by the normally open relay contact R1*a*, which is open because relay R1 is in the de-energized state when the third impulse is applied to the counter. However, thyratrons T–1 and T–2 of stage three will also be unaffected by the third impulse of the counter because, while the normally open contact R2*a* is closed, the normally open relay contact R1*a* is open and, hence, the shield grids of thyratrons T–1 and T–2 for stage three are biased at −8.5 volts through the normally closed contact R1*a* and the closed normally open contact R6*a* which is connected to the conductor 29. Of course, the thyratrons T–1 and T–2 for stages four and five of the counter will remain in their respective states as effected by reset of the counter.

Figure 3:
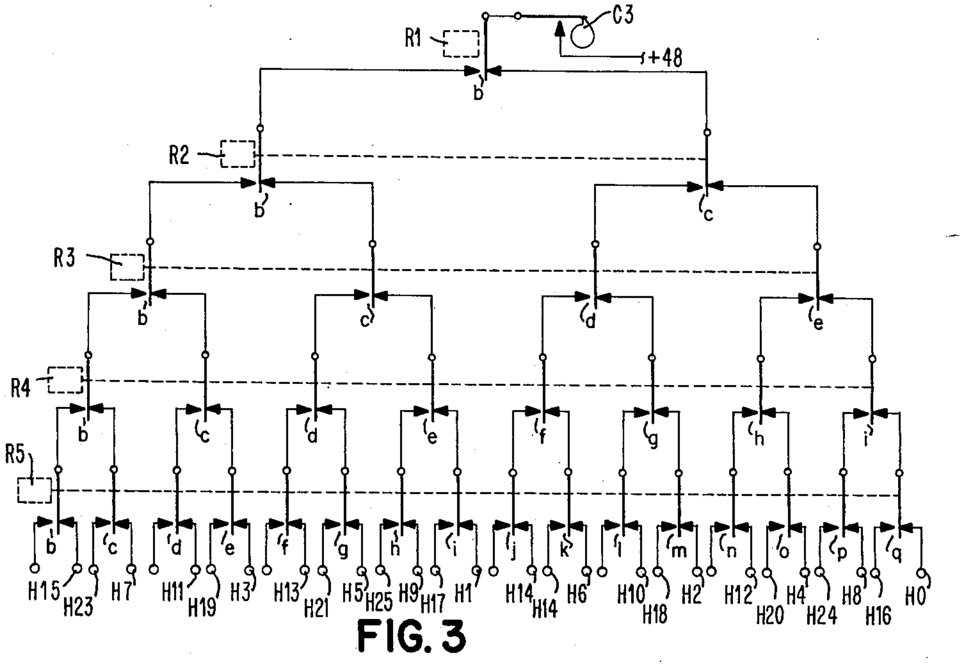
FIG. 3 is a schematic representation of the elements utilized for code conversion to enable discrete decimal outputs from the counter.

If no further impulses were applied to the counter during the counting period, the counter would have a decimal output 3 at the output H3, FIG. 3, read out during counter read out time. This is because thyratrons T-1 of stages two and three remained fired and unfired, respectively, and, therefore, relay R2 remained energized and relay R3 did not become energized. Hence, referring to FIG. 3, the decimal output 3 at the output hub H3 is traceable from the +48 volt supply through the closed normally open contact R1*b*, through the closed normally open contact R2*b*, and through the normally closed contacts R3*b*, R4*c* and R5*e*, respectively, to the output hub H3. Continued operation of the counter would be in the manner previously described.

Figure 5:
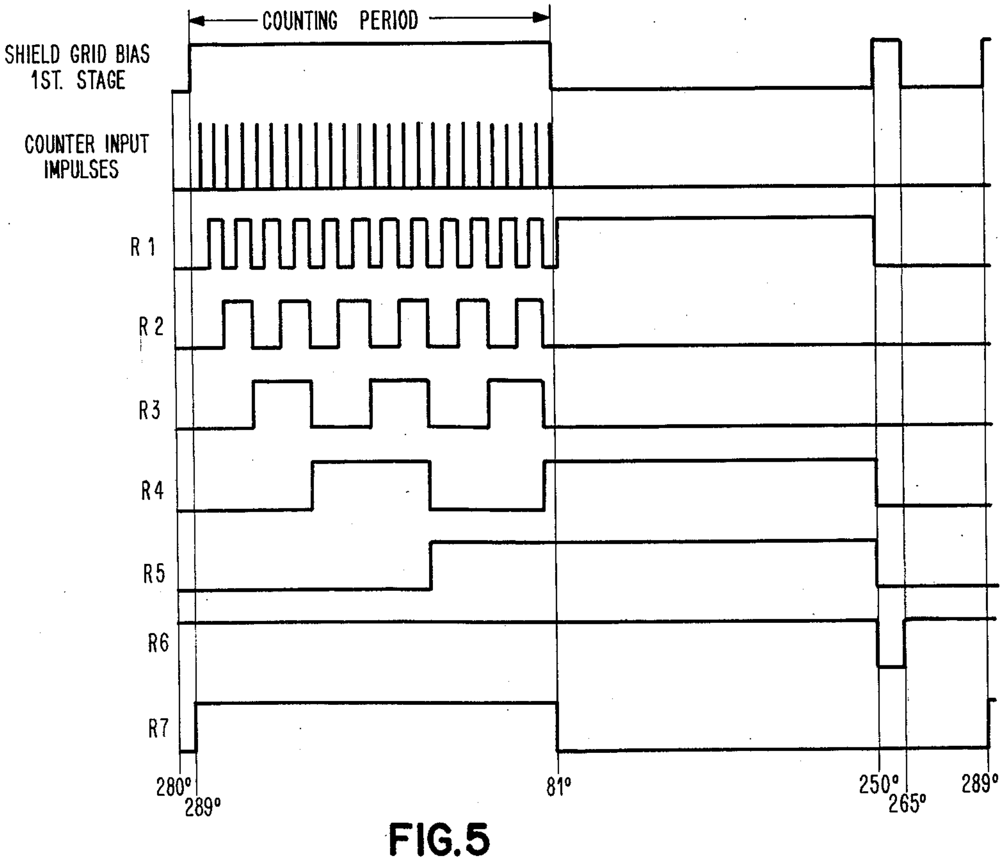
FIG. 5 is a waveform diagram of the shield grid bias for the thyratrons of the first stage, counter input pulses, and the conditions of certain relays during a preselected time interval.

By referring to FIG. 5, the condition of each of the relays R1, R2, R3, R4 and R5 can be noted with respect to each impulse applied to the counter during the counting period. It is seen that, shortly after the first impulse is applied to the counter, relay R1 becomes energized while relays R2, R3, R4 and R5 remain de-energized. As successive impulses are applied to the counter, the relays R1–R5, inclusive, become energized and de-energized as indicated in the above table. For further example, if seventeen impulses were applied to the counter during the counting period and the condition of the relays R1–R5, inclusive, were examined, it would be seen, as in FIG. 5, that relays R1 and R5 are energized and relays R2, R3 and R4 are de-energized. Moreover, in FIG. 3, the path for the decimal output 17 at output hub H17 may be traced from the +48 volt supply, through the closed normally open contacts R1*b*, through the normally closed contacts R2*b*, R3*c* and R4*e*, and through the closed normally open contact R5*i* to the output hub H17.

From the foregoing, it is seen that a counter has been provided which has a plurality of stages, each requiring conditioning in order to operate in a binary manner, whereby the same elements utilized for conditioning the stages of the counter are also employed for code conversion purposes to effect discrete decimal outputs.

Further, it is seen that the counter may be so comprised to be operative only during a preselected portion of a selected time interval and to have only one discrete decimal output during the preselected time interval.

It is also seen that an electromechanical counter has been provided which is capable of being reset instantaneously, if so desired, or may retain the value representing the total number of impulses applied because the elements for effecting the counting action are inherently electrical impulse storage devices.

While there have been shown and described and pointed out the fundamental novel features of the invention as applied to a preferred embodiment, it will be understood that various omissions and substitutions and changes in the form and details of the device illustrated and in its operation may be made by those skilled in the art, without departing from the spirit of the invention. It is the intention, therefore, to be limited only as indicated by the scope of the following claims.

What is claimed is:

1. A device of the type described for counting electrical impulses applied thereto comprising: a plurality of elements associated with each other to count in a binary manner the electrical impulses simultaneously applied thereto, and unitary means having first elements for selectively conditioning said plurality of elements to enable the same to count the simultaneously applied electrical impulses in a binary manner and second elements for converting the binary notation of any of the electrical impulses so applied to decimal notation.

2. In a device of the type described for counting electrical impulses applied thereto comprising: a plurality of elements each having two stable states and requiring conditioning prior to transfer from one state to the other, circuit means for connecting said elements to enable the same to count the electrical impulses applied simultaneously thereto in a binary manner upon said elements being properly conditioned, and unitary means having first elements for selectively conditioning said plurality of elements to enable the same to count the electrical impulses applied thereto in a binary manner and second elements for effecting conversion from binary notation of the impulses applied to the plurality of elements to decimal notation.

3. In a device of the type described for counting electrical impulses applied thereto comprising: a plurality of inherently binary counting elements commonly connected to said source of electrical impulses to become selectively energized, each of said elements requiring conditioning in order for said impulses to energize the same; unitary means including conditioning means for selectively conditioning said binary counting elements to enable the same to become selectively energized upon the impulses being applied thereto; and code conversion means including code conversion elements for converting the binary notation of the number of impulses applied to said binary counting elements to decimal notation.

4. An electromechanical counter for counting electrical impulses comprising: a plurality of thyratrons each having a plate, cathode, shield grid and control grids; first circuit means for capacitively coupling the plates of said plurality of thyratrons in pairs; second circuit means for commonly connecting the control grids of said plurality of thyratrons to permit said electrical impulses to be applied simultaneously thereto; third circuit means for commonly connecting the shield grids of the capacitively coupled pairs of thyratrons; and conditioning means for selectively biasing said shield grids to control ignition of said thyratrons upon application of said electrical impulses to said control grids so as to count said electrical impulses in a binary notation, said conditioning means including conversion elements for converting the binary notation of impulses applied to said thyratrons to decimal notation.

5. An electromechanical counter, according to claim 4, wherein said conditioning means comprises: first relay means for selectively biasing the shield grids of one pair of the pairs of said capacitively coupled thyratrons to enable ignition of the same upon application of electrical impulses to the control grids thereof; and second relay means associated with one thyratron of each of said pairs of thyratrons to permit said pairs of thyratrons to count said electrical impulses in a binary notation, said second relay means including conversion elements for converting the binary notation of the electrical impulses applied to the thyratrons to decimal notation.

6. An electromechanical counter, according to claim 5, further comprising: means for selectively controlling said first relay means whereby said shield grids of said one pair of capacitively coupled thyratrons will be biased to enable ignition of the same for a preselected period of time, and means for selectively controlling said conversion elements of said second relay means to permit conversion from binary notation to decimal notation at a preselected time interval.

7. An electromechanical counter, according to claim 6, further comprising: reset means for controlling said first and second relay means to cause ignition of the thyratrons capacitively coupled to the thyratrons associated with the second relay means of each pair of said pairs of thyratrons at a preselected time interval.

References Cited in the file of this patent

UNITED STATES PATENTS

| | | |
|---|---|---|
| 2,570,716 | Rochester | Oct. 9, 1951 |
| 2,761,620 | Lindesmith et al. | Sept. 4, 1956 |
| 2,774,868 | Havens | Dec. 18, 1956 |
| 2,814,762 | Jackson et al. | Nov. 26, 1957 |
| 2,816,709 | Barth | Dec. 17, 1957 |
| 2,887,590 | Warman | May 19, 1959 |